United States Patent
Wu et al.

(10) Patent No.: US 9,576,683 B2
(45) Date of Patent: Feb. 21, 2017

(54) SYSTEMS AND METHODS FOR HARD ERROR REDUCTION IN A SOLID STATE MEMORY DEVICE

(71) Applicant: Seagate Technology LLC, Cupertino, CA (US)

(72) Inventors: Yunxiang Wu, Cupertino, CA (US); Yu Cai, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 27 days.

(21) Appl. No.: 14/178,201

(22) Filed: Feb. 11, 2014

(65) Prior Publication Data

US 2015/0220388 A1 Aug. 6, 2015

Related U.S. Application Data

(60) Provisional application No. 61/936,599, filed on Feb. 6, 2014.

(51) Int. Cl.

| | | |
|---|---|---|
| *G11C 29/52* | (2006.01) | |
| *G11C 11/56* | (2006.01) | |
| *G11C 16/26* | (2006.01) | |
| *G11C 16/34* | (2006.01) | |
| *G11C 16/10* | (2006.01) | |

(Continued)

(52) U.S. Cl.
CPC ............ *G11C 29/52* (2013.01); *G06F 3/0619* (2013.01); *G06F 3/0688* (2013.01); *G06F 11/1012* (2013.01); *G06F 11/1068* (2013.01); *G06F 11/1072* (2013.01); *G11C 11/5628* (2013.01); *G11C 11/5642* (2013.01); *G11C 13/0033* (2013.01); *G11C 16/0483* (2013.01); *G11C 16/10* (2013.01); *G11C 16/26* (2013.01); *G11C 16/34* (2013.01); *G11C 16/3404* (2013.01); *G11C 16/349* (2013.01); *G11C 16/3427* (2013.01); *G11C 29/021* (2013.01);

(Continued)

(58) Field of Classification Search
CPC .. G11C 29/52; G11C 11/5642; G11C 11/5628; G11C 16/0483; G11C 16/26; G11C 16/3427; G11C 16/349; G11C 16/10; G11C 16/34; G11C 16/3404; G11C 2211/5634; G11C 13/0033; G11C 2013/0054; G11C 2211/5644; G11C 29/021; G11C 29/028; G11C 29/42; G06F 11/1068; G06F 11/1012; G06F 11/1072; G06F 3/0688
USPC .................. 714/773, 764, 49, 719; 711/103; 365/185.03, 185.18, 185.2, 185.12, 185.24, 365/185.02, 185.11, 185.22, 185.29, 189.07

See application file for complete search history.

(56) References Cited

U.S. PATENT DOCUMENTS

| | | |
|---|---|---|
| 5,892,896 A | 4/1999 | Shingo |
| 6,516,425 B1 | 2/2003 | Belhadj et al. |

(Continued)

FOREIGN PATENT DOCUMENTS

KR 10/2009-0013394 2/2009

OTHER PUBLICATIONS

U.S. Appl. No. 14/072,530, filed Nov. 5, 2013, Cai.

(Continued)

*Primary Examiner* — John J Tabone, Jr.
(74) *Attorney, Agent, or Firm* — Cesari & Reed, LLP; Kirk A. Cesari

(57) ABSTRACT

Systems and method relating generally to solid state memory, and more particularly to systems and methods for reducing errors in a solid state memory.

20 Claims, 4 Drawing Sheets

(51) Int. Cl.

| | | |
|---|---|---|
| *G11C 16/04* | (2006.01) | |
| *G11C 13/00* | (2006.01) | |
| *G06F 11/10* | (2006.01) | |
| *G06F 3/06* | (2006.01) | |
| *G11C 29/02* | (2006.01) | |
| *G11C 29/42* | (2006.01) | |
| *G11C 7/14* | (2006.01) | |
| *G11C 29/04* | (2006.01) | |

(52) U.S. Cl.
CPC ............ *G11C 29/028* (2013.01); *G11C 29/42* (2013.01); *G11C 7/14* (2013.01); *G11C 2029/0411* (2013.01)

(56) References Cited

U.S. PATENT DOCUMENTS

| | | | |
|---|---|---|---|
| 6,651,032 B2 | 11/2003 | Peterson et al. | |
| 7,127,549 B2 | 10/2006 | Sinclair | |
| 7,254,692 B1 | 8/2007 | Teoh et al. | |
| 7,310,699 B2 | 12/2007 | Sinclair | |
| 7,523,013 B2 | 4/2009 | Gorobets et al. | |
| 7,596,656 B2 | 9/2009 | Elhamias | |
| 7,721,146 B2 | 5/2010 | Polisetti et al. | |
| 7,778,077 B2 | 8/2010 | Gorobets et al. | |
| 8,010,738 B1 | 8/2011 | Chilton et al. | |
| 8,085,591 B2* | 12/2011 | Moschiano | G11C 11/5628 365/185.02 |
| 8,151,137 B2 | 4/2012 | McKean et al. | |
| 8,174,912 B2 | 5/2012 | Warren | |
| 8,176,367 B2 | 5/2012 | Dreifus | |
| 8,289,768 B2 | 10/2012 | Warren et al. | |
| 8,381,077 B2 | 2/2013 | Warren | |
| 8,458,416 B2 | 6/2013 | Warren et al. | |
| 8,499,220 B2 | 7/2013 | Warren | |
| 8,539,311 B2* | 9/2013 | Steiner | G06F 11/1072 714/764 |
| 8,560,765 B2 | 10/2013 | Warren | |
| 8,804,421 B2* | 8/2014 | Motwani | G11C 16/26 365/185.03 |
| 2002/0091965 A1 | 7/2002 | Moshayedi | |
| 2005/0044459 A1 | 2/2005 | Scheuerlein et al. | |
| 2005/0172067 A1 | 8/2005 | Sinclair | |
| 2005/0204187 A1 | 9/2005 | Lee et al. | |
| 2005/0209804 A1 | 9/2005 | Basso et al. | |
| 2006/0245248 A1 | 11/2006 | Hu | |
| 2007/0028040 A1 | 2/2007 | Sinclair | |
| 2007/0266200 A1 | 11/2007 | Gorobets et al. | |
| 2008/0010557 A1 | 1/2008 | Kume | |
| 2008/0046779 A1 | 2/2008 | Merchant et al. | |
| 2008/0086275 A1 | 4/2008 | Astigarraga et al. | |
| 2008/0162079 A1 | 7/2008 | Astigarraga et al. | |
| 2008/0307270 A1 | 12/2008 | Li | |
| 2009/0063895 A1 | 3/2009 | Smith | |
| 2009/0067303 A1 | 3/2009 | Poo et al. | |
| 2009/0147698 A1 | 6/2009 | Potvin | |
| 2009/0172280 A1 | 7/2009 | Trika et al. | |
| 2009/0190396 A1* | 7/2009 | Cho | G11C 11/5642 365/185.03 |
| 2009/0204853 A1 | 8/2009 | Diggs et al. | |
| 2009/0282301 A1 | 11/2009 | Flynn et al. | |
| 2010/0121609 A1 | 5/2010 | Gorinevsky | |
| 2010/0122148 A1 | 5/2010 | Flynn et al. | |
| 2010/0306577 A1 | 12/2010 | Dreifus et al. | |
| 2010/0306580 A1 | 12/2010 | McKean et al. | |
| 2011/0058415 A1 | 3/2011 | Warren | |
| 2011/0060862 A1 | 3/2011 | Warren | |
| 2011/0060865 A1 | 3/2011 | Warren et al. | |
| 2011/0286271 A1* | 11/2011 | Chen | G11C 7/1006 365/185.09 |
| 2012/0102261 A1 | 4/2012 | Burger et al. | |
| 2012/0110376 A1 | 5/2012 | Dreifus et al. | |
| 2012/0224420 A1* | 9/2012 | Sakurada | G11C 8/08 365/185.03 |
| 2012/0317460 A1* | 12/2012 | Chilappagari | G06F 11/1048 714/773 |
| 2013/0155776 A1* | 6/2013 | Chilappagari | G11C 16/34 365/185.24 |
| 2013/0311837 A1* | 11/2013 | Bedeschi | G06F 11/1048 714/49 |
| 2014/0119114 A1* | 5/2014 | Motwani | G11C 11/5642 365/185.03 |
| 2014/0173174 A1* | 6/2014 | Frickey | G11C 11/5628 711/103 |
| 2015/0078078 A1* | 3/2015 | D'Abreu | G11C 16/10 365/185.03 |
| 2015/0078079 A1* | 3/2015 | D'Abreu | G11C 16/10 365/185.03 |
| 2015/0085575 A1* | 3/2015 | Tam | G11C 29/50004 365/185.11 |
| 2015/0113354 A1* | 4/2015 | Wu | G06F 11/1068 714/764 |
| 2015/0149698 A1* | 5/2015 | Cai | G11C 11/5628 711/103 |
| 2015/0149840 A1* | 5/2015 | Alhussien | H03M 13/1125 714/719 |
| 2015/0149871 A1* | 5/2015 | Chen | G06F 11/1068 714/773 |
| 2015/0154069 A1* | 6/2015 | Tuers | G06F 11/1068 714/773 |
| 2015/0178152 A1* | 6/2015 | Cai | G06F 11/1068 714/757 |

OTHER PUBLICATIONS

U.S. Appl. No. 14/072,571, filed Nov. 5, 2013, Wu.
U.S. Appl. No. 14/085,553, filed Nov. 20, 2013, Cai.
U.S. Appl. No. 14/108,226, filed Dec. 16, 2013, Chen.
U.S. Appl. No. 14/178,201, filed Feb. 11, 2014, Wu.
U.S. Appl. No. 14/047,423, Unpublished (filed Oct. 7, 2013) (Haitao Xia).
U.S. Appl. No. 14/072,530, Unpublished (filed Nov. 5, 2013) (Yu Cai).
U.S. Appl. No. 14/072,574, Unpublished (filed Nov. 5, 2013) (Yunxiang Wu).
U.S. Appl. No. 14/108,226, Unpublished (filed Dec. 16, 2013) (Zhengang Chen).
U.S. Appl. No. 14/085,553, Unpublished (filed Nov. 20, 2013) (Yu Cai).
U.S. Appl. No. 13/912,063, Unpublished (filed Jun. 6, 2013) (Fan Zhang).

* cited by examiner

SYSTEMS AND METHODS FOR HARD ERROR REDUCTION IN A SOLID STATE MEMORY DEVICE

CROSS REFERENCE TO RELATED APPLICATIONS

The present application claims priority to (is a nonprovisional of) U.S. Pat. App. No. 61/936,599 entitled "Systems and Methods for Hard Error Reduction in a Solid State Memory Device", and filed Feb. 6, 2014 by Wu et al. The entirety of the aforementioned provisional patent application is incorporated herein by reference for all purposes.

FIELD OF THE INVENTION

Systems and method relating generally to solid state memory, and more particularly to systems and methods for reducing errors in a solid state memory.

BACKGROUND

Data in a solid state storage device decays over time requiring more error correction capability over time. To correct additional errors, enhanced error correction circuitry may be employed. However, such enhanced error correction circuitry may not be able to correct all mis-programming errors occurring in a solid state memory device.

Hence, for at least the aforementioned reasons, there exists a need in the art for advanced systems and methods for reducing errors in a solid state storage device.

SUMMARY

Systems and method relating generally to solid state memory, and more particularly to systems and methods for reducing errors in a solid state memory.

Various embodiments of the present invention provide methods for writing data to a solid state memory device. The methods include: programming a multi-bit cell of a memory device with a first value selected based upon a first bit value; reading the cell of the memory device using a currently modified reference value to yield a read data; programming the multi-bit cell of the memory device with a second value selected based upon a combination of a second bit value and the read data; and generating the currently modified reference value such that it yields a reduced bit error rate of the read data compared with a previous modified reference value.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
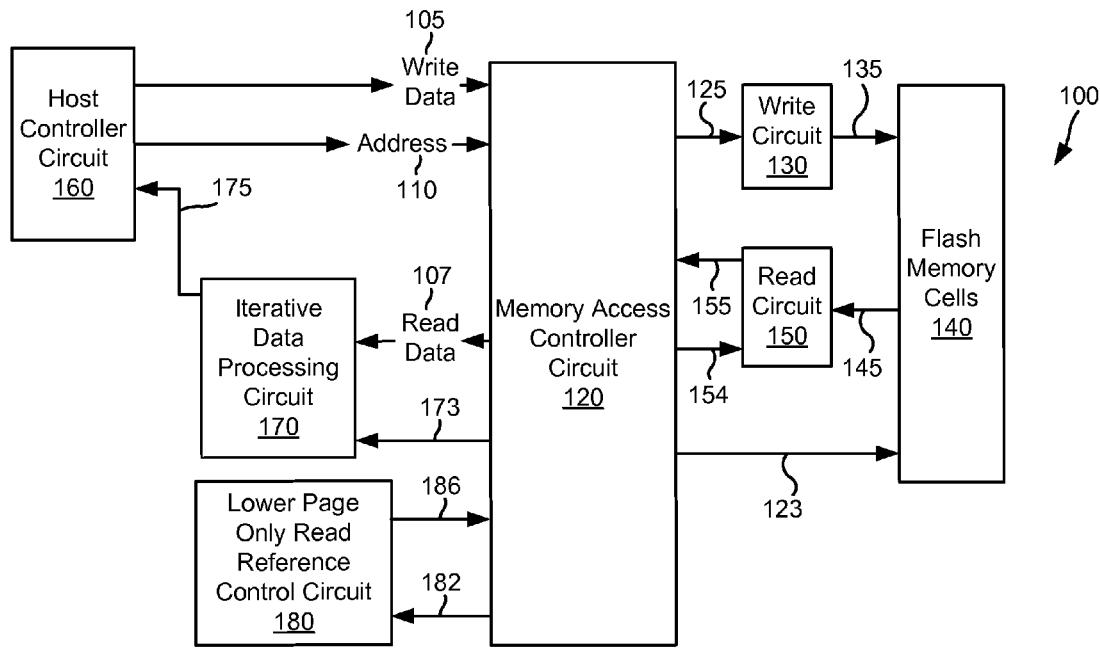
FIG. 1 shows a solid state storage device including a lower page only read reference control circuit in accordance with various embodiments of the present invention.

Systems and method relating generally to solid state memory, and more particularly to systems and methods for reducing errors in a solid state memory.

Various embodiments of the present invention provide methods for writing data to a solid state memory device. The methods include: programming a multi-bit cell of a memory device with a first value selected based upon a first bit value; reading the cell of the memory device using a currently modified reference value to yield a read data; programming the multi-bit cell of the memory device with a second value selected based upon a combination of a second bit value and the read data; and generating the currently modified reference value such that it yields a reduced bit error rate of the read data compared with a previous modified reference value.

In some instances of the aforementioned embodiments, generating the currently modified reference value includes: programming two or more cells of a selected region of the memory device with a known pattern; reading back the two or more cells of the selected region of the memory device using a first test value as a reference voltage to yield a first read back data set; comparing the first read back data set with the known pattern; generating a first bit error rate corresponding to the first test value based upon the comparison of the first read back data set with the known pattern; reading back the two or more cells of the selected region of the memory device using a second test value as a reference voltage to yield a second read back data set; comparing the second read back data set with the known pattern; and generating a second bit error rate corresponding to the second test value based upon the comparison of the second read back data set with the known pattern. In some cases, the multi-bit cell of the memory device is a two-bit cell. In other cases, the multi-bit cell of the memory device is a three-bit cell. Based upon the disclosure provided herein, one of ordinary skill in the art will recognize a variety a numbers of bits per memory cell to which the method may be applied in accordance with different embodiments of the present invention.

In some cases, the generating the currently modified reference value further includes erasing the two or more cells of the selected region of the memory device and/or selecting the one of the first test value or the second test value as the currently modified reference value based at least in part on a comparison of the first bit error rate and the second bit error rate. In various cases, a first distribution corresponding to a first programming level of the two or more cells of the selected region of the memory device and a second distribution corresponding to a second programming level of the two or more cells of the selected region of the memory device overlap. In some such cases, the lower of the first bit error rate and the second bit error rate corresponds to a test value that is closer to the intersection of a first distribution and the second distribution.

Other embodiments of the present invention provide data storage systems that include: a memory device, a memory device access circuit, and a reference control circuit. The memory device access circuit is operable to: program a multi-bit cell of a memory device with a first value selected based upon a first bit value; read the multi-bit cell of the memory device using a currently modified reference value to yield a read data; and program the multi-bit cell of the memory device with a second value selected based upon a combination of a second bit value and the read data. The reference control circuit is operable to generate the currently modified reference value such that it yields a reduced bit error rate of the read data compared with a previous modified reference value.

In some cases, at least the memory device access circuit and the reference control circuit of the aforementioned embodiment are incorporated in an integrated circuit. In other cases, the entire system of the aforementioned embodiment is implemented on an integrated circuit. In one or more cases, the memory device is a flash memory device.

In some instances of the aforementioned embodiment, generating the currently modified reference value by the reference control circuit is done by the reference control circuit operable to: program two or more multi-bit cells of a selected region of the memory device with a known pattern; read back the two or more multi-bit cells of the selected region of the memory device using a first test value as a reference voltage to yield a first read back data set; compare the first read back data set with the known pattern; generate a first bit error rate corresponding to the first test value based upon the comparison of the first read back data set with the known pattern; read back the two or more multi-bit cells of the selected region of the memory device using a second test value as a reference voltage to yield a second read back data set; compare the second read back data set with the known pattern; and generate a second bit error rate corresponding to the second test value based upon the comparison of the second read back data set with the known pattern. In some cases, generating the currently modified reference value by the reference control circuit is done by the reference control circuit further operable to: erase the two or more multi-bit cells of the selected region of the memory device and/or select the one of the first test value or the second test value as the currently modified reference value based at least in part on a comparison of the first bit error rate and the second bit error rate.

Yet other embodiments of the present invention provide flash memory storage systems that include: a memory device including a plurality of multi-bit flash memory cells; a memory device access circuit; and a reference control circuit. Memory device access circuit is operable to: program a multi-bit flash memory cell of the memory device with a first value selected based upon a first bit value; read the multi-bit flash memory cell of the memory device using a currently modified reference value to yield a read data; and program the multi-bit flash memory cell of the memory device with a second value selected based upon a combination of a second bit value and the read data. The reference control circuit is operable to: program two or more multi-bit flash memory cells of a selected region of the memory device with a known pattern; read back the two or more multi-bit flash memory cells of the selected region of the memory device using a first test value as a reference voltage to yield a first read back data set; compare the first read back data set with the known pattern; generate a first bit error rate corresponding to the first test value based upon the comparison of the first read back data set with the known pattern; read back the two or more multi-bit flash memory cells of the selected region of the memory device using a second test value as a reference voltage to yield a second read back data set; compare the second read back data set with the known pattern; generate a second bit error rate corresponding to the second test value based upon the comparison of the second read back data set with the known pattern; and select the one of the first test value or the second test value as the currently modified reference value based at least in part on a comparison of the first bit error rate and the second bit error rate Turning to FIG. 1, a solid state storage device 100 including a lower page only read reference control circuit 180 is shown in accordance with various embodiments of the present invention. Storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '01' | V3 |
| '00' | V2 |
| '10' | V1 |
| '11' | V0 |

Of course, other bit patterns may be assigned to different thresholds.

A data read is effectuated when host controller circuit 160 provides address 110 along with a request to read data from the corresponding location in flash memory cells 140. Memory access controller 120 accesses a read voltage 145 from locations indicated by address 123 and compares the voltage to a number of threshold values 154 to reduce the voltage to a multi-bit read data 155. Using the same two bit example, the following multi-bit read data 155 results:

| Voltage Input | Two Bit Data Output |
|---|---|
| >V2 | '01' |
| >V1 | '00' |
| >V0 | '10' |
| <=V0 | '11' |

This multi-bit read data 155 is provided from memory access controller 120 to data processing circuit 170 as read data 107. Iterative data processing circuit 170 applies a data decoding algorithm to read data 107 using soft data 173 that is either accessed or generated by memory access controller circuit 120. Soft data may either be provided from flash memory cells 140 where such are available, or may be generated by memory access controller circuit 120. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Iterative data processing circuit 170 repeatedly applies a data decoding algorithm to read data 107 and soft data 173 to yield a decoded output. Where the decoded output converges (i.e., results in a correction of all remaining errors in read data 107), the decoded output is provided as read data 175. Where the decoded output fails to converge (i.e., errors remain in the decoded output), another iteration of the data decoding algorithm is applied to read data 107 guided by the previous decoded output to yield an updated decoded output. This process continues until either all errors are corrected or a timeout condition occurs (e.g., 100 iterations). In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention.

Voltage thresholds 154 include an lower page only threshold value that may be changed from time to time to reflect the changes in flash memory cells 140. The lower page only threshold value included in voltage thresholds 154 is set by lower page only read reference control circuit 180. In particular, lower page only read reference control circuit 180 provides a threshold value 186 to memory access controller circuit 120 that is provided as the lower page only threshold value included in voltage thresholds 154. Lower page only read reference control circuit 180 calculates threshold value 186 based upon a bit error rate 182 from memory access controller circuit 120. The calibration of threshold value 186 is more fully described below in relation to FIG. 6. The general read/write operation of solid state storage device 100 is more fully described below in relation to FIG. 2.

Figure 3:
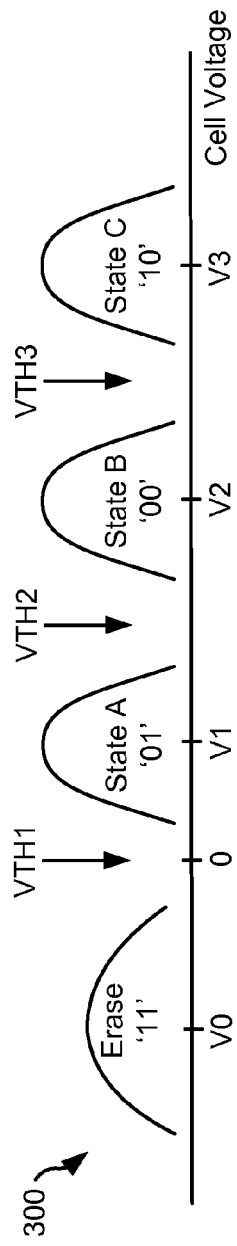
FIG. 3 graphically depicts voltage distribution and midstate thresholds for a two bit memory device.

Turning to FIG. 3, a voltage distribution 300 for a two bit memory device is shown. This two bit memory device represents respective cells of flash memory cells 140. It should be noted that voltage distribution 300 is merely an example, and that other distributions are possible in accordance with different embodiments of the present invention.

Further, it should be noted that flash memory cells 140 are not limited to two bit memory cells, and that various embodiments of the present invention may utilize single bit or three or more bit memory cells. As shown, voltage distribution 400 exhibits four voltage states (ERASE, STATE A, STATE B, and STATE C) each distinguishable using a respective voltage threshold (VTH1, VTH2, VTH3) located at a midpoint between a respective voltage state. As an example, the ERASE state may represent a '11', STATE A may represent a '01', STATE B may represent a '11', and STATE C may represent a '10'. Over time, the mid-point between the lower page states may become blurred resulting in errors. To reduce the effects of this problem, a lower page only threshold value is adjusted to reduce the number of errors.

Figure 4:
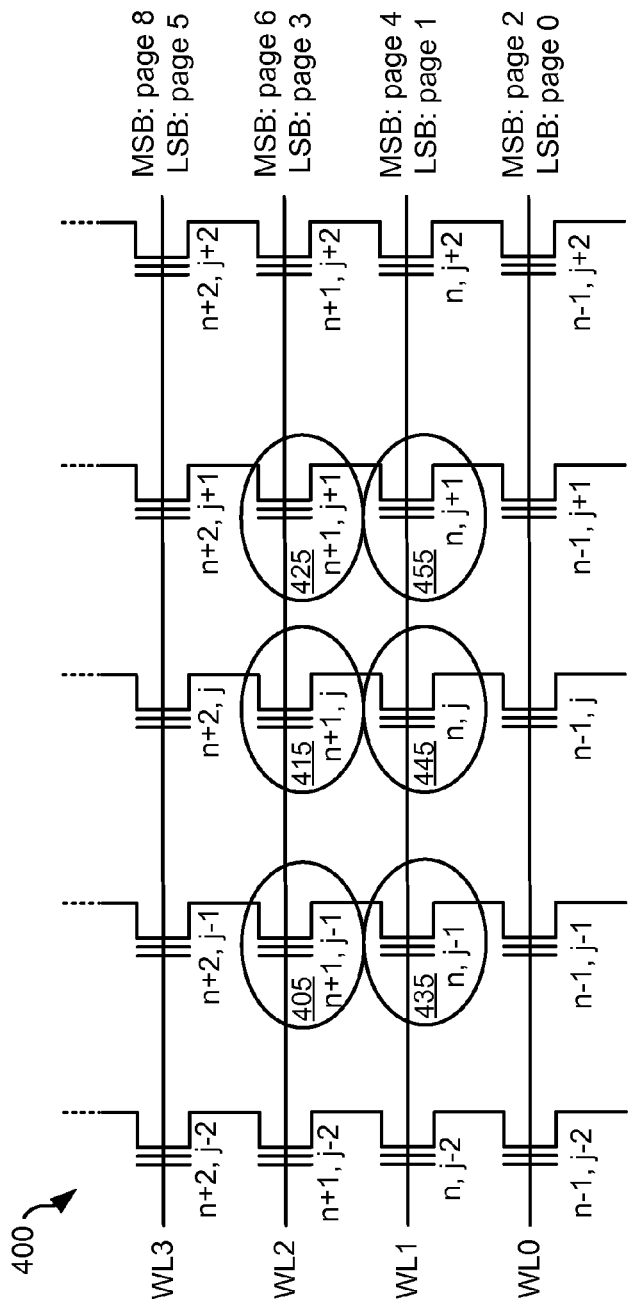
FIG. 4 shows a selection of cells from a solid state memory device showing a number of wordlines and column lines.

Turning to FIG. 4, a selection of cells 400 from solid state memory device 100 are shown including a number of wordlines (WL0, WL1, WL2, WL3) and column lines (CL0, CL1, CL2, CL3, CL4). In this case, wordline WL1 is selected as the defined wordline and includes at least cells 435, 445, 455. Wordline WL0 including at least cells 465, 475, 485 is one of the direct neighbors of the defined wordline, and wordline WL2 including at least cells 405, 415, 425 is the other of the direct neighbors of the defined wordline. Such cells are programmed using a multi-step programming process. In particular, the cells are initially all written to an erase state. Subsequently, the least significant bits of each of the cells are initially programmed. Where, for example, the least significant bit of a given cell is to be programmed to be a logic '1' the voltage to which the cell is charged is below a reference voltage VTH2 from FIG. 3. In contrast, where the least significant bit of a given cell is to be programmed to be a logic '0' the voltage to which the cell is charged is above the reference voltage VTH2 from FIG. 3. This programming results in an 'X1' state corresponding to a logic '1' or an 'X0' state corresponding to a logic '0'. The programmed cells are then read back into a least significant bit storage buffer maintained as part of memory access controller circuit 120.

The data to be stored as the most significant bits of the respective cells is loaded into a least significant bit storage buffer maintained as part of memory access controller circuit 120. Finally, the target threshold range for the combination of the least significant bit and the most significant bit for each of the cells is selected and used to program the respective cells. For example, where the combination of the least significant bit and the most significant bit is a '11', the voltage to which the cell is charged is below the reference voltage VTH1 from FIG. 3; where the combination of the least significant bit and the most significant bit is a '01', the voltage to which the cell is charged is below the reference voltage VTH2 from FIG. 3 and above the reference voltage VTH1 from FIG. 3; where the combination of the least significant bit and the most significant bit is a '00', the voltage to which the cell is charged is below the reference voltage VTH3 from FIG. 3 and above the reference voltage VTH2 from FIG. 3; and where the combination of the least significant bit and the most significant bit is a '10', the voltage to which the cell is charged is above the reference voltage VTH3 from FIG. 3.

One problem with the aforementioned programming approach occurs where there is ambiguity between the aforementioned 'X1' state and 'X0' state. Such ambiguity can result in the difference between programming a cell in the Erase state or State C of FIG. 3 which is a significant difference, and such an error may be difficult for iterative data processing circuit 170 to correct. Because of this, lower page only read reference control circuit 180 operates to reduce the ambiguity and therefore the number of errors caused by the ambiguity.

Figure 5A:
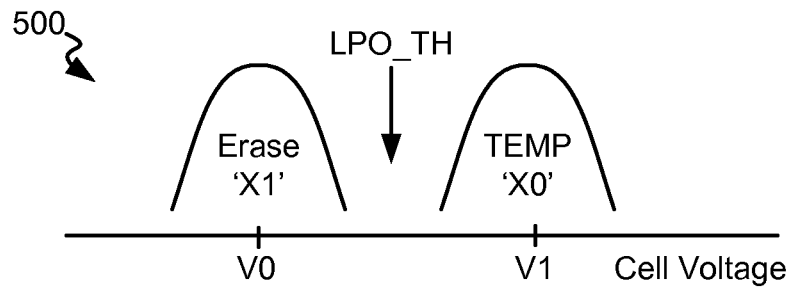
FIGS. 5a-5b graphically depict voltage distributions for lower page only reads during different wear points of a solid state memory device.
Figure 5B:
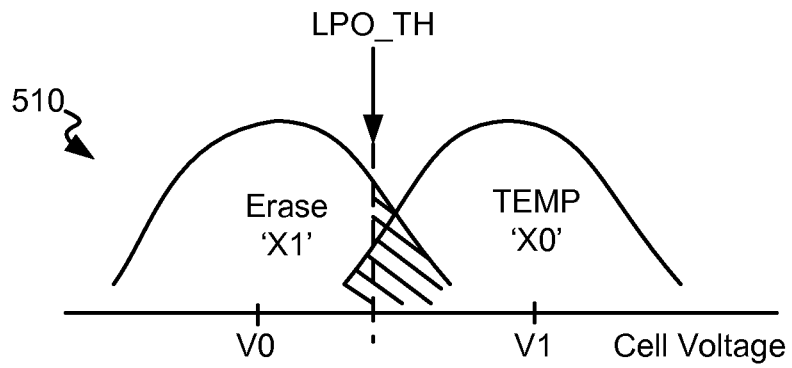
Figure 5C:
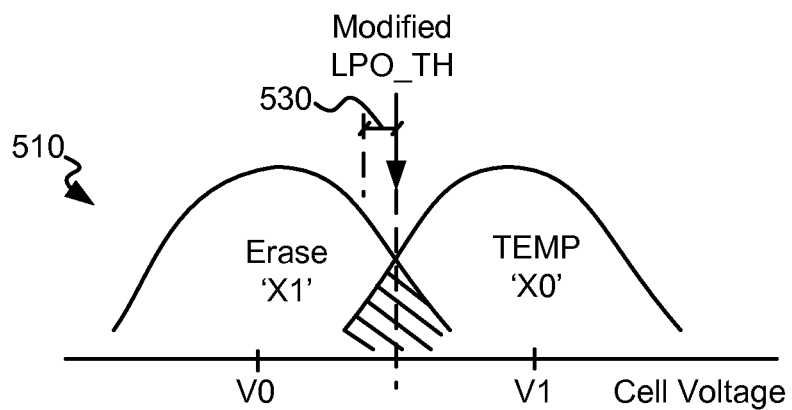
FIG. 5c graphically depicts a bit error rate reduction through modification of a lower page only threshold value.

Turning to FIGS. 5*a*-5*c*, an example of the ambiguity between the aforementioned 'X1' and 'X0' states is graphically shown, along with a mitigation approach for reducing the ambiguity. Turning to FIG. 5*a*, a voltage distribution 500 shows a voltage distribution for a exemplary lower page only read during an early use of flash memory cells 140. As shown, voltage distribution 500 includes an erase state 'X1' surrounding a threshold V0 and a temporary state 'X0' surrounding a threshold V1. As shown, the separation between the erase state and the temporary state is significant, and the distinct states are easily distinguished using a lower page only read threshold (LPO_TH). In contrast, turning to FIG. 5*b*, a voltage distribution 510 shows a voltage distribution for a exemplary lower page only read during a later use (e.g., after 5000 program erase cycles) of flash memory cells 140. As shown, voltage distribution 510 includes an erase state 'X1' surrounding a threshold V0 and a temporary state 'X0' surrounding a threshold V1. As shown, there is an overlap of the erase state and the temporary state that results in ambiguity and errors during a lower page only read. This ambiguity and the corresponding errors come from a region indicated by cross-hatching, and are increased as the lower page only read threshold (LPO_TH) is offset from the intersection of the erase state and the temporary state. FIG. 5*c* shows the same voltage distribution of FIG. 5*b*, except that the lower page only read threshold (LPO_TH) is modified (i.e., shifted by a value 530) to yield a modified lower page only read threshold (Modified LPO_TH) that corresponds to approximately the intersection of the erase state and the temporary state. This reduces the ambiguity and the corresponding errors that come from a region indicated by cross-hatching when compared with the location of the lower page only read threshold (LPO_TH) of FIG. 5*b*. Returning to FIG. 1, lower page only read reference control circuit 180 is responsible for adjusting threshold 186 to correspond to approximately the intersection of the erase state and the temporary state that exists after first level programming on flash memory cells 140, and thereby reduces the error incidence where threshold 186 is included as the lower page only threshold value included in voltage thresholds 154, and is used for read back.

Figure 2:
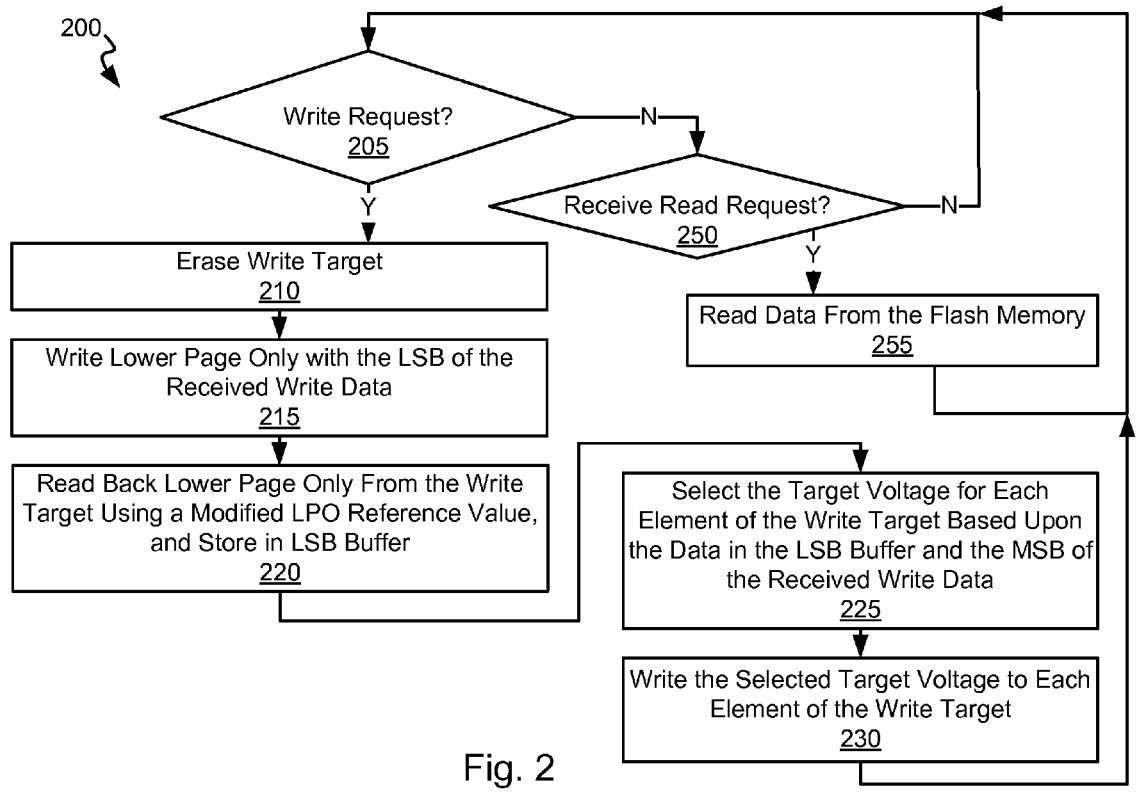
FIG. 2 is a flow diagram showing a method in accordance with some embodiments of the present invention for accessing a solid state memory device using a modified LPO reference value.

Turning to FIG. 2, a flow diagram 200 shows a method in accordance with some embodiments of the present invention for accessing a solid state memory device using a modified lower page only read threshold. Following flow diagram 200, it is determined whether a write request is received (block 205). Where a write request is received (block 205), it includes a location within the flash memory cells that are the target of the write. Where a write request is received (block 205), the target of the write (i.e., the designated locations within the flash memory cells) are erased (block 210). The least significant bits of the write data are stored to the respective cells of the target write (block 215). Where the least significant bit of a given cell is to be programmed to be a logic '1' the voltage to which the cell is charged is below a reference voltage VTH2 from FIG. 3. In contrast, where the least significant bit of a given cell is to be programmed to be a logic '0' the voltage to which the cell is charged is above the reference voltage VTH2 from FIG. 3. This programming results in an 'X1' state corresponding to a logic '1' or an 'X0' state corresponding to a logic '0'. The programmed cells are then read back and stored to a least significant bit storage buffer (block 220). This read back is done using a modified lower page only reference value that is calibrated to be at approximately the intersection of the 'X0' state and the 'X1' state for a cell exhibiting ambiguity. This process of calibrating the modified lower page only reference value is discussed more fully below in relation to FIG. 6.

A target voltage is selected for each cell of the write target based upon a combination of the data in the least significant bit storage buffer and corresponding most significant bit information in the received write data (block 225). For example, where the combination of the least significant bit and the most significant bit is a '11', the voltage to which the cell is charged is below the reference voltage VTH1 from FIG. 3; where the combination of the least significant bit and the most significant bit is a '01', the voltage to which the cell is charged is below the reference voltage VTH2 from FIG. 3 and above the reference voltage VTH1 from FIG. 3; where the combination of the least significant bit and the most significant bit is a '00', the voltage to which the cell is charged is below the reference voltage VTH3 from FIG. 3 and above the reference voltage VTH2 from FIG. 3; and where the combination of the least significant bit and the most significant bit is a '10', the voltage to which the cell is charged is above the reference voltage VTH3 from FIG. 3. The respective cells are charged with the selected target voltage to write the cell (block 230).

Alternatively, where a write request is not received (block 205), it is determined whether a read request is received (block 250). Where a read request is received (block 250), it includes an address indicating a location from which the data is to be accessed. Data is then accessed from the flash memory cells at the location indicated by the read request (block 255).

Figure 6:
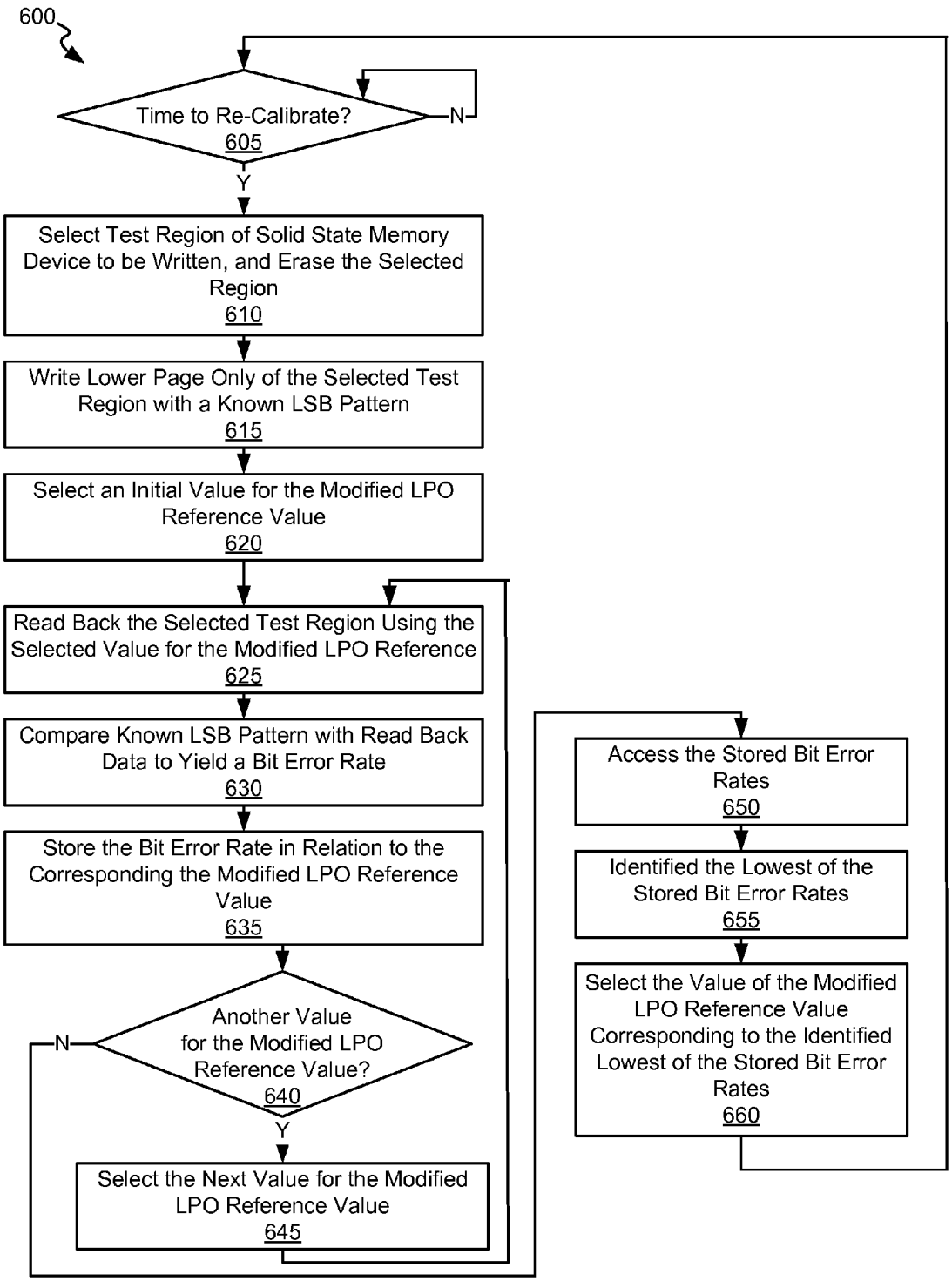
FIG. 6 is a flow diagram showing a method for calibrating a modified LPO reference value in accordance with some embodiments of the present invention.

Turning to FIG. 6, a flow diagram 600 shows a method for calibrating a modified lowest page only reference value in accordance with some embodiments of the present invention. Following flow diagram 600, it is determined whether it is time to calibrate the modified lowest page only reference value (block 605). This determination may be made, for example, based upon a number of program/erase cycles to which the flash memory cells have been subjected. In one particular embodiment of the present invention, the calibration is performed after each 1000 program/erase cycles. Based upon the disclosure provided herein, one of ordinary skill in the art will recognize other numbers of program/ erase cycles that may be used to trigger a calibration of the modified lowest page only reference value. As another example, the determination to perform a calibration of the modified lowest page only reference value may be based on a bit error rate of data being accessed from the flash memory cells. Based upon the disclosure provided herein, one of ordinary skill in the art will recognize a variety of basis upon which it may be determined that a calibration of the modified lowest page only reference value should be performed.

Where it is determined that a calibration of the modified lowest page only reference value is to be performed (block 605), a test region of the solid state memory device is selected and erased (block 610). A known least significant bit pattern is written to the lower page only region of the cells in the selected region (block). The known least significant bit pattern may be selected as any pattern. In some cases, the known least significant bit pattern is designed to provide some variation in programming levels across the cells. In one particular embodiment of the present invention, the known least significant bit pattern is a repeating pattern of '101010101010 . . . .' Based upon the disclosure provided herein, one of ordinary skill in the art will recognize other patterns that may be used for the known least significant bit pattern.

An initial value is selected for the modified lowest page only reference value (block 620). The data is read back from the selected test region using the selected value for the modified lowest page only reference (block 625), and the known least significant bit pattern is compared with the read back data to yield a bit error rate (block 630). This bit error rate is stored in relation to the corresponding lowest page only reference value that was used during the read back (block 635).

It is determined whether one or more additional values for the modified lowest page only reference remain to be tested (block 640). In some cases, a defined range of values for the modified lowest page only reference are tested, with each successive value of the modified lowest page only reference being an increment from the last one tested. In various cases, once three or more successive instances of the modified lowest page only reference are shown to cause an increasing bit error rate, then the minimum bit error rate is considered to have been found and no more values for the modified lowest page only reference are considered to remain for testing. Where additional values for the modified lowest page only reference remain to be tested (block 640), the next value of the modified lowest page only reference is selected (block 645) and the processes of blocks 625-640 are repeated for the newly selected value of the modified lowest page only reference.

Otherwise, once the range of values of the modified lowest page only reference have been tested (block 640), the resulting stored bit error rates are accessed from memory (block 650), and the lowest of the stored bit error rates is identified (block 655). The instance of the modified lowest page only reference value that corresponds to the identified, lowest bit error rate is selected as the modified lowest page only reference value that will be used in performing writes to the solid state memory device until the next calibration process is triggered (block 660).

It should be noted that the process of calibrating the modified lowest page only reference value has been discussed in relation to a two-bit per cell flash memory device, that that the process may be modified for use in relation to a three or more bit per cell flash memory device. In such a case where it is applied to a three-bit per cell memory device, the calibration may be performed for the read back after a write of the least significant bit to calibrate the lowest page only reference value. In some such cases, the calibration may also be performed for the read back after a write of the second least significant bit to calibrate the second lowest page only reference value.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for writing data to a solid state memory device, the method comprising:
   programming a multi-bit cell of a memory device with a first value selected based upon a first bit value;
   reading the multi-bit cell of the memory device using a first selected reference value as a first reference voltage to yield a first read data;
   compare the first bit value with the first read data to determine a first bit error rate;
   store the first bit error rate;
   reading the multi-bit cell of the memory device using a second selected reference value as a second reference voltage to yield a second-read data;
   compare the first bit value with the second read data to determine a second bit error rate;
   compare the first bit error rate to the second bit error rate and determine which has a lowest bit error rate; and
   setting a modified reference value based on a reference value that yields the lowest bit error rate, the modified reference value to be utilized for future writes to the solid state memory device.

2. The method of claim 1, wherein programming a multi-bit cell of the memory device with the first value further comprises:
   erasing the two or more multi-bit cells of the selected region of the memory device.

3. The method of claim 1, wherein a first distribution corresponding to a first programming level of the two or more cells of the selected region of the memory device and a second distribution corresponding to a second programming level of the two or more multi-bit cells of the selected region of the memory device overlap.

4. The method of claim 3, wherein a lower of the first bit error rate and the second bit error rate is selected to correspond to a test value that is closer to the intersection of the first distribution and the second distribution.

5. The method of claim 1, wherein the multi-bit cell of the memory device is a two-bit cell.

6. The method of claim 1, wherein the multi-bit cell of the memory device is a three-bit cell.

7. The method of claim 1 further comprising
   receiving a write request and associated write data;
   programming a lower page of the multi-bit cell of the memory device with a least significant bit of the write data;
   reading the lower page using a predetermined reference value as a reference voltage to yield a lower page read data; and
   selecting a target voltage for writes to the multi-bit cell of the memory device based upon a combination of a most significant bit of the write data and the lower page read data; and
   modifying the predetermined reference value based upon the method of claim 1.

8. A data storage system, the system comprising:
a memory device;
a memory device access circuit configured to:
   program a multi-bit cell of a memory device with a first value selected based upon a first bit value;
   read the multi-bit cell of the memory device using a first reference value as a reference voltage to yield a read data;
   select a target voltage for writes to the multi-bit cell of the memory device based upon a combination of a second bit value and the read data; and
a reference control circuit configured to modify the target voltage based on a bit error rate of a test region of the memory device.

9. The system of claim 8, wherein at least the memory device access circuit and the reference control circuit are incorporated in an integrated circuit.

10. The system of claim 8, wherein the system is implemented on an integrated circuit.

11. The system of claim 8, wherein the memory device is a flash memory device.

12. The system of claim 8, wherein modifying the target voltage includes:
   programming two or more multi-bit cells of a selected region of the memory device with a known pattern;
   reading back the two or more multi-bit cells of the selected region of the memory device using a first test value as a reference voltage to yield a first read back data set;
   comparing the first read back data set with the known pattern;
   generating a first bit error rate corresponding to the first test value based upon the comparison of the first read back data set with the known pattern;
   reading back the two or more multi-bit cells of the selected region of the memory device using a second test value as a reference voltage to yield a second read back data set;
   comparing the second read back data set with the known pattern; and
   generating a second bit error rate corresponding to the second test value based upon the comparison of the second read back data set with the known pattern.

13. The system of claim 8, wherein the memory device access circuit is further configured to:
   erase the multi-bit cell of the memory device prior to programming the multi-bit cell of the memory device with the first value.

14. The system of claim 12, wherein the reference control circuit further configured to:
   select one of the first test value or the second test value as a modified target value based at least in part on a comparison of the first bit error rate and the second bit error rate.

15. The system of claim 12, wherein a first distribution corresponding to a first programming level of the two or more multi-bit cells of the selected region of the memory device and a second distribution corresponding to a second programming level of the two or more multi-bit cells of the selected region of the memory device overlap.

16. The system of claim 12, wherein a lower of the first bit error rate and the second bit error rate corresponds to a test value that is closer to the intersection of the first distribution and the second distribution.

17. The system of claim 8, wherein the multi-bit cell of the memory device is a two-bit cell.

18. The system of claim 8, wherein the multi-bit cell of the memory device is a three-bit cell.

19. A flash memory storage system, the system comprising:
a memory device including a plurality of multi-bit flash memory cells;
a memory device access circuit configured to:
   program a multi-bit flash memory cell of the memory device with a first value selected based upon a first bit value;
   read the multi-bit flash memory cell of the memory device using a target reference value to yield a read data;
   program the multi-bit flash memory cell of the memory device with a second value selected based upon a combination of a second bit value and the read data; and
a reference control circuit configured to modify the target reference value and configured to:
   program two or more multi-bit flash memory cells of a selected region of the memory device with a known pattern;
   read back the two or more multi-bit flash memory cells of the selected region of the memory device using a first test value as a reference voltage to yield a first read back data set;
   compare the first read back data set with the known pattern;
   generate a first bit error rate corresponding to the first test value based upon the comparison of the first read back data set with the known pattern;
   read back the two or more multi-bit flash memory cells of the selected region of the memory device using a second test value as a reference voltage to yield a second read back data set;
   compare the second read back data set with the known pattern;
   generate a second bit error rate corresponding to the second test value based upon the comparison of the second read back data set with the known pattern; and
   select the one of the first test value or the second test value as the target reference value based at least in part on a comparison of the first bit error rate and the second bit error rate.

20. The flash memory storage system of claim 19, wherein the reference control circuit is further configured to select the one of the first test value or the second test value as the target reference value by selecting one of the first test value or the second test value that yields a lowest bit error rate.

* * * * *